(12) United States Patent
Chung et al.

(10) Patent No.: US 7,612,638 B2
(45) Date of Patent: Nov. 3, 2009

(54) WAVEGUIDES IN INTEGRATED CIRCUITS

(75) Inventors: Shine Chung, Sanchong (TW); Fu-Lung Hsueh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 269 days.

(21) Appl. No.: 11/486,903

(22) Filed: Jul. 14, 2006

(65) Prior Publication Data
US 2008/0012663 A1  Jan. 17, 2008

(51) Int. Cl.
*H01P 3/00* (2006.01)
*H01P 3/12* (2006.01)
*H01P 3/14* (2006.01)
*H01P 1/00* (2006.01)
*H01P 1/06* (2006.01)

(52) U.S. Cl. ........... 333/239; 333/236; 333/240; 333/241; 333/242; 333/245; 333/248; 333/257

(58) Field of Classification Search ........... 333/239, 333/248
See application file for complete search history.

(56) References Cited

U.S. PATENT DOCUMENTS 5,107,231 A * 4/1992 Knox .............. 333/109
5,982,256 A * 11/1999 Uchimura et al. ........ 333/239

FOREIGN PATENT DOCUMENTS

CN  20A20090403  2/2009

* cited by examiner

Primary Examiner—Rexford N Barnie
Assistant Examiner—Matthew C. Tabler
(74) Attorney, Agent, or Firm—K&L Gates LLP

(57) ABSTRACT

A waveguide in semiconductor integrated circuit is disclosed, the waveguide comprises a horizontal first metal plate, a horizontal second metal plate above the first metal plate, separated by an insulation material, and a plurality of metal vias positioned in two parallel lines, running vertically through the insulation material in contacts with both the first and second metal plates, wherein the first and second metal plates and the plurality of metal vias form a metal enclosure in a cross-sectional view that can serve as a waveguide.

19 Claims, 4 Drawing Sheets

WAVEGUIDES IN INTEGRATED CIRCUITS

BACKGROUND

The present invention relates generally to integrated circuit (IC) design, and, more particularly, to waveguide designs in an integrated circuit.

In semiconductor devices, transmission lines are always needed to transmit signals either on a chip level or on a board level. There are four major transmission line constructions: microstrip, stripline, coaxial line and waveguide.

A microstrip is a thin, flat electrical conductor separated from a ground plane by a layer of insulation or an air gap. A stripline is similar to a microstrip, except that the stripline is sandwiched between two ground planes and respective insulating layers. A coaxial line has a conducting line in the center and a second conducting layer running all the way around the exterior circumference. The inner and outer conductors are separated by a dielectric layer. A waveguide is simply an all-around metal enclosure from a cross-sectional view.

It is relatively easy to form microstrip and stripline in integrated circuits as they are two dimension structures. But waveguide has a number of advantages over microstrip and stripline. It is completely shielded so that an excellent isolation between adjacent signals can be obtained. It can transmit extremely high peak powers and has very low loss, almost negligible, at microwave frequencies.

Therefore, it is desirable to be able to build waveguide transmission lines in integrated circuits.

SUMMARY

In view of the foregoing, a waveguide in semiconductor integrated circuit is disclosed. The waveguide comprises a horizontal first conductive plate, a horizontal second conductive plate above the first conductive plate, separated by an insulation material, and a plurality of conductive vias positioned in two parallel lines, running vertically through the insulation material in contacts with both the first and second conductive plates, wherein the first and second conductive plates and the plurality of conductive vias form a conductive enclosure in a cross-sectional view that can serve as a waveguide.

The construction and method of operation of the invention, however, together with additional objects and advantages thereof will be best understood from the following description of specific embodiments when read in connection with the accompanying drawings.

DESCRIPTION

Figure 1:
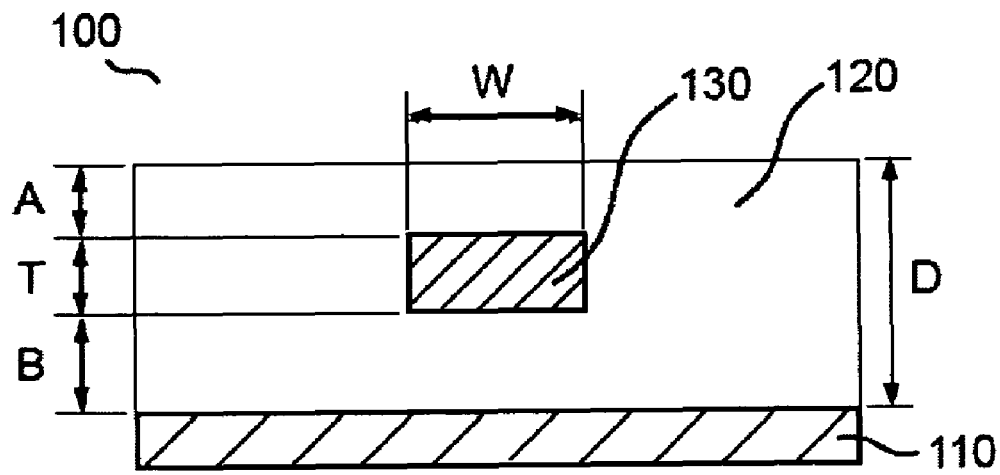
FIG. 1 is a cross-sectional diagram of a microstrip.

FIG. 1 is a cross-sectional diagram of a microstrip 100. When implemented in an integrated circuit, a ground plate 110 is a conductive layer such as a metal layer deposited on a substrate. After a deposition of an insulation material 120, a metal strip 130 is then deposited on top of the insulation material 120. Then another layer of the insulation material 120 is deposited on top of the metal strip 130 and the existing layer of the insulation material 120, so that the metal strip 130 is completely enclosed by the insulation material 120, and runs parallel with the bottom metal ground plate 110.

Figure 2:
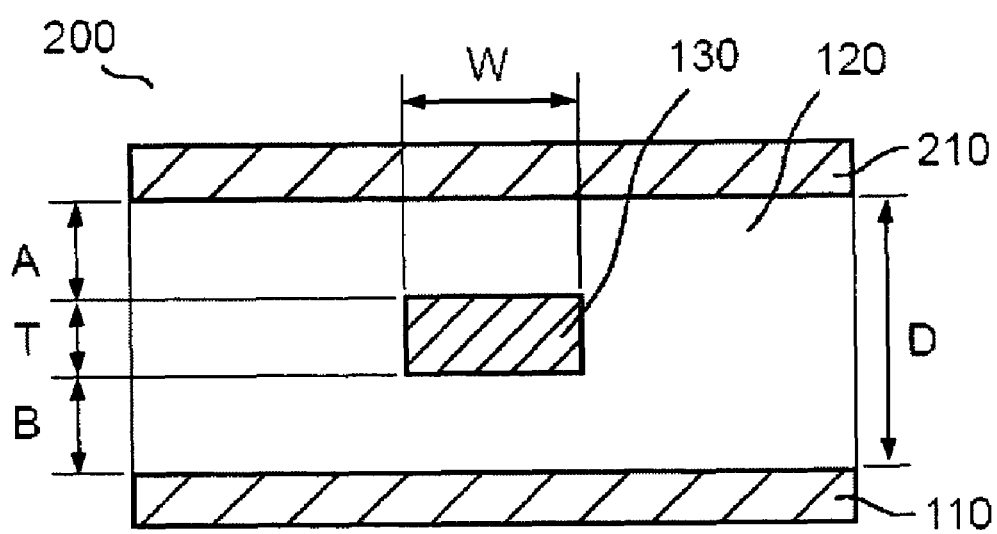
FIG. 2 is a cross-sectional diagram of a stripline.

FIG. 2 is a cross-sectional diagram of a stripline 200, also implemented in an integrated circuit. A difference between the microstrip 100 as shown in FIG. 1 and the stripline 200 as shown in FIG. 2 is that an additional metal ground plate 210 is deposited on top of the finished microstrip 100 as shown FIG. 1. So that the metal strip 130 is sandwiched between two parallel ground metal plate 110 and 210 as shown in FIG. 2. Note that both the microstrip 100 shown in FIG. 1, and the stripline 200 shown in FIG. 2 are not enclosed structures.

Figure 3:
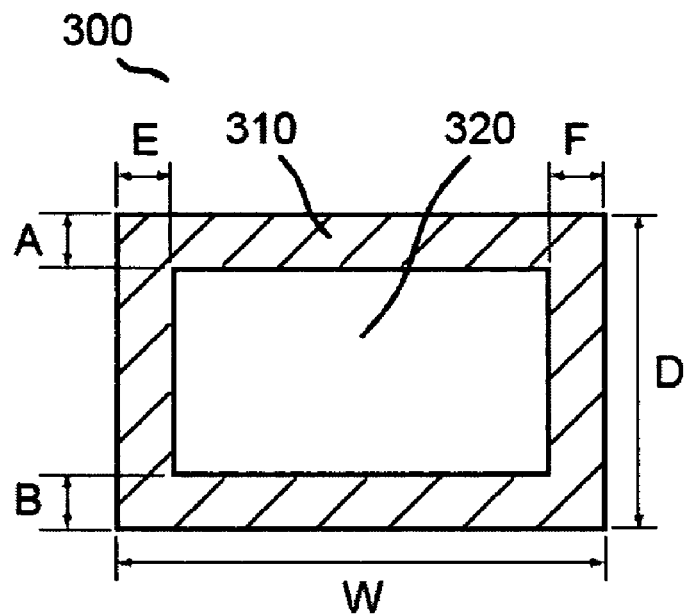
FIG. 3 is a cross-sectional diagram of a waveguide made of metal enclosure.

FIG. 3 is a cross-sectional diagram of a waveguide made of metal enclosure that can be used for transmitting microwaves to an antenna.

Figure 4:
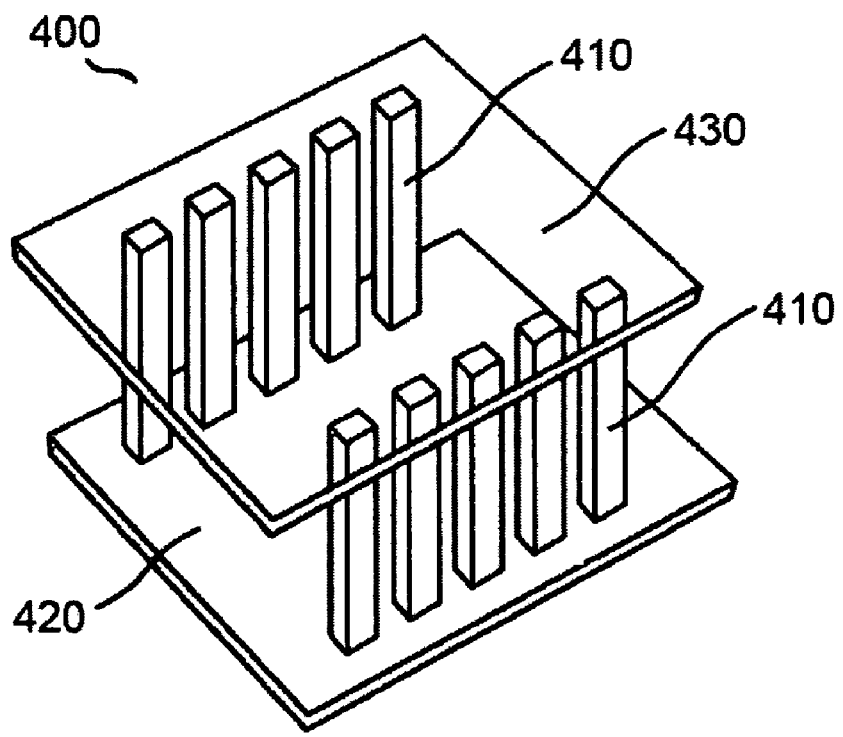
FIG. 4 is a perspective view of a waveguide implemented in an integrated circuit according to one embodiment of the present invention.

FIG. 4 is a perspective view of a waveguide 400 implemented in an integrated circuit according to one embodiment of the present invention. Sidewalls of the waveguide 400 are formed by two lines of metal vias 410, between a bottom metal plate 420 and a top metal plate 430. If spacing between two adjacent vias 410 in the same line is much less than a wavelength, the lines of vias can be considered as a metal plate from electromagnetic standpoint. Normally the via spacing less than about ⅒ of a wavelength of an electromagnetic wave is sufficiently small to be considered a metal plate. So for millimeter wave with wavelength about 1 mm, the via 410 spacing should be less than 100 um. For vertical laser diode with wavelength of 850 nm, the via 410 spacing should be less than 85 nm. For vertical laser diode with wavelength of 1.3 um, the via 410 spacing should be less than 130 nm.

A vertical-cavity-surface-emitting-laser (VCSEL) is a type of semiconductor laser diode with laser beam emission perpendicular to a top surface, which is different from conventional edge-emitting semiconductor lasers that emit laser beams from surfaces formed by cleaving individual chips out of a wafer. Typical wavelengths of VCSELs are from 650 nm to 1300 nm, and they are typically built on gallium arsenide (GaAs) wafers.

Referring to FIG. 4, the minimum spacing between two adjacent vias 410 in the same array is determined by design rules. In a 0.18 um technology, the via spacing design rule can be 0.4 um. If two vias are too close to each other, complete metal filling of the via holes may not be guaranteed. But since the vias 410 here are used for forming the waveguide 400, and not for establishing solid connections between two metal plates 420 and 430, so the minimum spacing design rule can be ignored, i.e., the via spacing can even be zero. In zero via spacing case, the sidewalls of the waveguide become continual metal walls to form a complete enclosure.

Referring to FIG. 4, if a metal line is deposited between the two metal plates 420 and 430, and runs parallel between the two via lines, then the waveguide becomes a coaxial line.

Figure 5A:
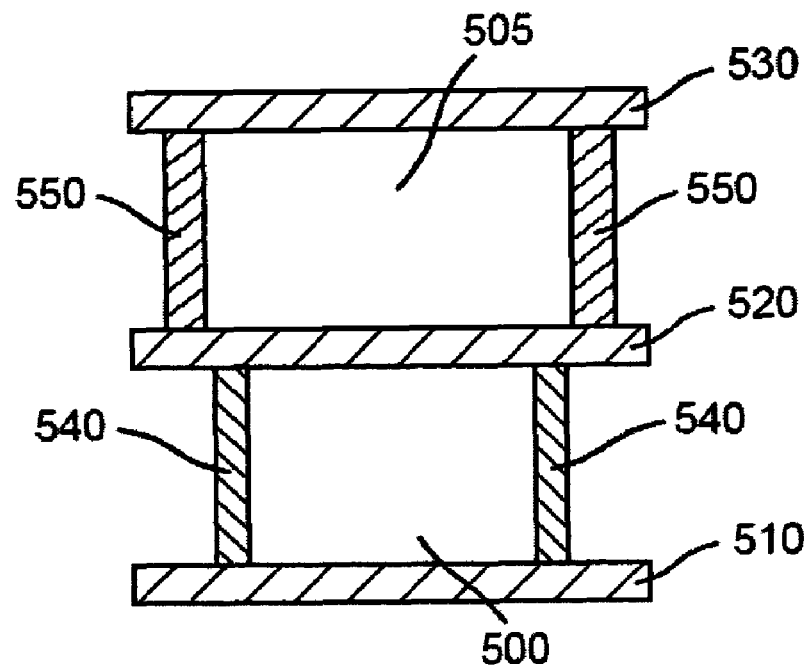
FIGS. 5A–5C are cross-sectional diagrams of waveguides alternatively implemented in an integrated circuit according to other embodiments of the present invention.
Figure 5B:
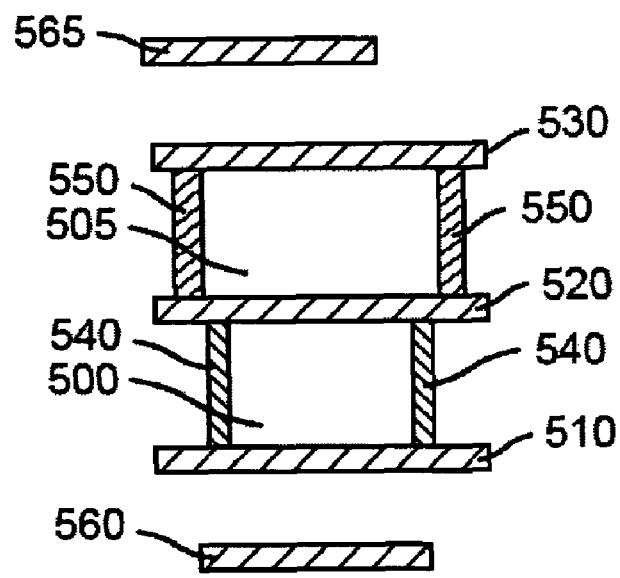
Figure 5C:
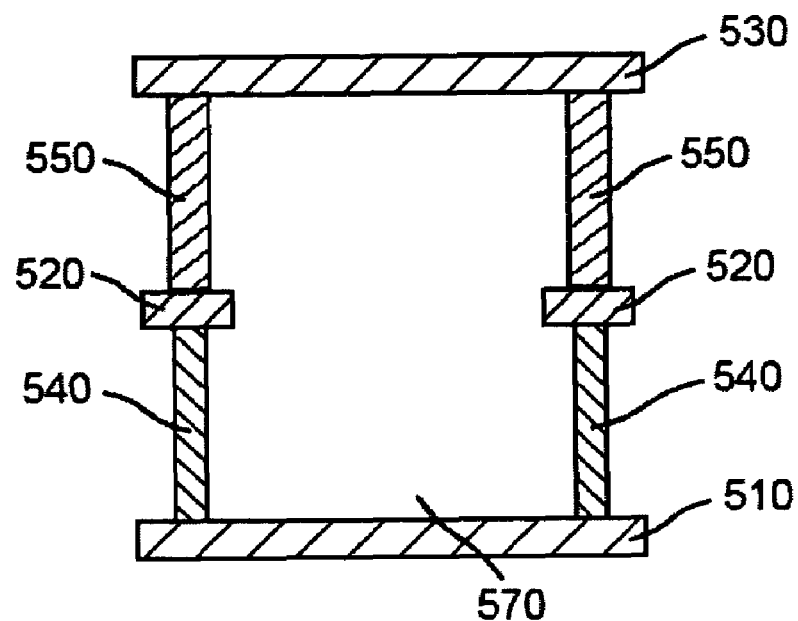

FIGS. 5A–5C are cross-sectional diagrams of waveguides alternatively implemented in an integrated circuit according to other embodiments of the present invention.

FIG. 5A is a cross-sectional diagram of two stacked waveguides 500 and 505 implemented in an integrated circuit. Here a process for building the integrated circuit has at least three metal layers 510, 520 and 530. A first via array 540 is formed between metal layers 510 and 520. A second via array 550 is formed between metal layers 520 and 530. Process principles of forming the stacked waveguides 500 and 505 are similar to the forming of the single stack waveguide 400 as shown in FIG. 4, albeit additional via and metal processing steps are employed.

FIG. 5B is a cross-sectional diagram showing the two stacked waveguides 500 and 505 as shown in FIG. 5A, are sandwiched between two additional metal layers 560 and 565, with metal layer 560 below the waveguides 500 and 505, and metal layer 565 above the waveguides 500 and 505. The structure shown in FIG. 5B is an illustration that a waveguide does not have to be formed between a top and a bottom metal layers. Any two layers of metals can form a waveguide, which is further illustrated by FIG. 5C.

FIG. 5C is a cross-sectional diagram showing a waveguide 570 formed by two stacks of via arrays, 540 and 550. The purpose of the middle metal layer 520 is to assist via arrays 540 and 550 to make contacts to each other. The middle metal layer 520 is empty inside the waveguide 570. So the sidewalls of the waveguide are formed by two stacks of via arrays 540 and 550.

Referring to FIGS. 4 through 5C, the top and bottom metal layers do not have to be continuous metal plate, they can have openings with a diameter less than the space between two adjacent vias. Because some semiconductor manufacturers may require a large metal plate to have openings to release stress.

Referring to FIGS. 1 through 5, the semiconductor substrates used for building aforementioned microstrips, striplines or waveguides can be silicon, glass or III-V (GaAs; etc.) compound materials. Silicon-on-insulation (SOI) or glass-on-insulation (GOI) can also serve as the substrate. The bottom metal plate does not have to be deposited directly on the substrate. It can be deposited on top of an insulation layer. There can be other metal layers and other insulation layers underneath the insulation layer. In addition, a variety of semiconductor devices can be formed in the substrate. The variety of semiconductor devices can be MOSFET, bipolar transistors, resistors, inductors and capacitors, etc.

This invention can also be applied to L-shaped waveguides, directional couplers and other microwave devices, as semiconductor manufacturing involves mostly lithographic and chemical processes, which has much greater geographic flexibility than mechanical processes.

The same concept of using dense via array to mimic metal planes to guide electromagnetic waves can also be used to shield the same waves. In many integrated circuits, there are certain parts of circuitries, such as a low noise amplifier, are very sensitive to electromagnetic interferences generated by other circuitries or transmission lines, often times these circuitries need to be shielded. A traditional way of shielding them is to put metal strips around the sensitive circuits, and a metal plate on top of the circuit areas. But with the dense via arrays added to the sidewalls, the shield becomes a complete three-dimensional enclosure.

Figure 6:
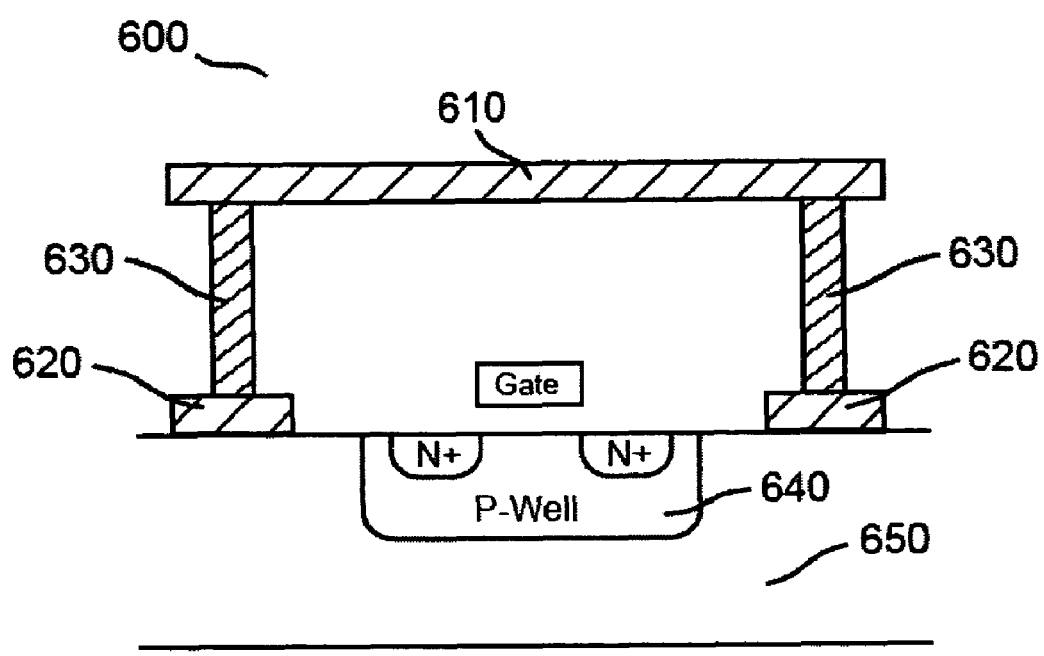
FIG. 6 is a cross-sectional diagram of an electromagnetic shield formed by conductive plates and vias.

FIG. 6 is a cross-sectional diagram of electromagnetic shield 600 formed by a metal plate 610 on top, two metal strips 620 as surround, and two via arrays 630 on the sides. A NMOS transistor 640 in a semiconductor substrate 650 represents the sensitive circuitries, which is completely shielded by the metal plate 610 on top and via arrays 630 on the sides.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A waveguide in semiconductor integrated circuits, the waveguide comprising:
    a horizontal first metal plate;
    a horizontal second metal plate above the first metal plate, separated by a first insulation material; and
    a first plurality of separate metal vias aligned to form two parallel planes, running vertically through the insulation material in contact with both the first and second metal plates, wherein the first and second metal plates and the two parallel planes formed by the vias further form a first metal enclosure in a cross-sectional view,
    wherein a minimum via spacing between two adjacent metal vias in the same plane is less than about one tenth of a wavelength of an electromagnetic radiation transmitting through the first metal enclosure, and
    wherein the horizontal first metal plate or the horizontal second metal plate has one or more openings with a diameter less than the minimum via spacing between two adjacent metal vias in the same plane.

2. The waveguide of claim 1 further comprises a semiconductor substrate below the first metal plate, wherein a plurality of semiconductor devices can be built upon.

3. The waveguide of claim 1, wherein the first metal plate is made of copper, copper alloy, aluminum or aluminum alloy.

4. The waveguide of claim 1, wherein the second metal plate is made of copper, copper alloy, aluminum or aluminum alloy.

5. The waveguide of claim 1, wherein the first plurality of separate metal vias is made of copper, copper alloy, aluminum, aluminum alloy or tungsten.

6. The waveguide of claim 1, wherein the two parallel planes further comprises:
    one or more via stacks comprising a second plurality of separate metal vias running vertically through the insulation material, stacked on top of and located approximately in line with the first plurality of separate metal vias; and
    one or more metal strips situated between and in contact with both the first and second pluralities of separate metal vias,
    wherein the two parallel planes is formed by the via stacks on top of the first plurality of separate metal vias and the metal strips.

7. The waveguide of claim 1 further comprising a first electrical conductive line circumferenced by the first insulation material inside the first metal enclosure, running parallel to the first and second metal plates, wherein the electrical conductive line forms a core conductor, and the first metal enclosure forms an outer conductive layer of a coaxial line.

8. The waveguide of claim 1 further comprising:
    a horizontal third metal plate above the second metal plate, separated from the second metal plate by a second insulation material; and a third plurality of separate metal vias positioned in two parallel planes, running vertically through the second insulation material in contacts with both the second and third metal plates, wherein the second and third metal plates and the third plurality of separate metal vias form a second metal enclosure in a cross-sectional view.

9. The waveguide of claim 8, wherein the third metal plate is made of copper, copper alloy, aluminum or aluminum alloy.

10. The waveguide of claim 8, wherein the third metal plate has one or more openings.

11. The waveguide of claim 8 further comprising a second electrical conductive line circumferenced by the second insulation material inside the second metal enclosure, running parallel to the second and third metal plates, wherein the second electrical conductive line forms a second core conductor, and the second metal enclosure forms an outer conductive layer of a second coaxial line.

12. A waveguide in semiconductor integrated circuits, the waveguide comprising:
    a semiconductor substrate for forming a plurality of semiconductor devices;
    a horizontal first metal plate above the semiconductor substrate, separated from the plurality of semiconductor devices by a first insulation material;
    a horizontal second metal plate above the first metal plate, separated by a second insulation material; and
    a first plurality of separate metal vias aligned to form two parallel planes, running vertically through the second insulation material in contact with both the first and second metal plates, wherein the first and second metal plates and the two parallel planes formed by the vias further form a first metal enclosure in a cross-sectional view,
    wherein a minimum via spacing between two adjacent metal vias in the same plane is less than about one tenth of a wavelength of an electromagnetic radiation transmitting through the first metal enclosure, and
    wherein the first metal plate or the second metal plate has one or more openings with a diameter less than the minimum via spacing between two adjacent metal vias in the same plane.

13. The waveguide of claim 12, wherein the first metal plate is made of copper, copper alloy, aluminum or aluminum alloy.

14. The waveguide of claim 12, wherein the second metal plate is made of copper, copper alloy, aluminum or aluminum alloy.

15. The waveguide of claim 12, wherein the first plurality of vias is made of copper, copper allay, aluminum, aluminum alloy or tungsten.

16. The waveguide of claim 12, wherein the two parallel planes further comprises:
    one or more via stacks comprising a second plurality of separate metal vias running vertically through the insulation material, stacked on top of and located approximately in line with the first plurality of separate metal vias; and
    one or more metal strips situated between and in contact with both the first and second pluralities of separate metal vias,
    wherein the two parallel planes is formed by the via stacks on top of the first plurality of separate metal vias and the metal strips.

17. The waveguide of claim 12 further comprising a first electrical conductive line circumferenced by the first insulation material inside the first metal enclosure, running parallel to the first and second metal plates, wherein the electrical conductive line forms a core conductor, and the first metal enclosure forms an outer conductive layer of a coaxial line.

18. The waveguide of claim 12 further comprising:
    a horizontal third metal plate above the second metal plate, separated from the second metal plate by a third insulation material; and
    a third plurality of separate metal vias positioned in two parallel planes, running vertically through the second insulation material in contacts with both the second and third metal plates,
    wherein the second and third metal plates and the third plurality of metal vias form a second metal enclosure in a cross-sectional view.

19. The waveguide of claim 18 further comprising a second electrical conductive line circumferenced by the third insulation material inside the second metal enclosure, running parallel to the second and third metal plates, wherein the second electrical conductive line forms a second core conductor, and the second metal enclosure forms an outer conductive layer of a second coaxial line.

* * * * *